United States Patent [19]

Michel

[11] Patent Number: 4,682,119
[45] Date of Patent: Jul. 21, 1987

[54] CLASS AB AMPLIFIER AND A DISTORTION CORRECTOR THEREFOR

[75] Inventor: Jean Michel, Trappes, France

[73] Assignee: Thomson-CSF, Paris, France

[21] Appl. No.: 822,834

[22] Filed: Jan. 27, 1986

[30] Foreign Application Priority Data

Jan. 25, 1985 [FR] France .................................. 85 01081

[51] Int. Cl.$^4$ ............................................. H03F 1/32
[52] U.S. Cl. ...................................... 330/149; 358/35; 358/184
[58] Field of Search ...................... 330/149; 332/37 R; 328/162; 358/35, 184; 455/50

[56] References Cited

U.S. PATENT DOCUMENTS

| | | | |
|---|---|---|---|
| 3,042,867 | 7/1962 | Thompson | 330/149 X |
| 3,564,445 | 2/1971 | Brokaw | 330/149 X |
| 4,152,665 | 5/1979 | Cunningham | 330/149 X |
| 4,178,559 | 12/1979 | Nichols | 330/149 X |

FOREIGN PATENT DOCUMENTS

| | | | |
|---|---|---|---|
| 28181 | 5/1981 | European Pat. Off. | 330/149 |
| 2044249 | 2/1971 | France . | |
| 754646 | 8/1980 | U.S.S.R. | 330/149 |

*Primary Examiner*—James B. Mullins
*Attorney, Agent, or Firm*—Cushman, Darby & Cushman

[57] ABSTRACT

A class AB amplifier and its distortion corrector are provided for obtaining linear amplification, even for low input signal levels. For this, at low levels, the distortion corrector has a response $Vs'=f(Ve')$ (with $Ve'$ and $Vs'$: input and output voltages of the corrector) whose representative curve has a concavity turned towards the increasing values of $Vs'$ whereas, up to now, a prejudice born of an insufficiently precise study of class AB amplifiers led to an inverse curve for the response of the corrector.

2 Claims, 10 Drawing Figures

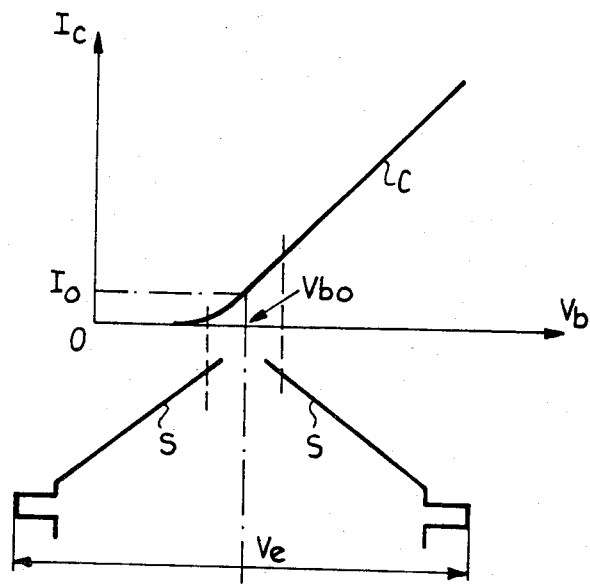
FIG_1
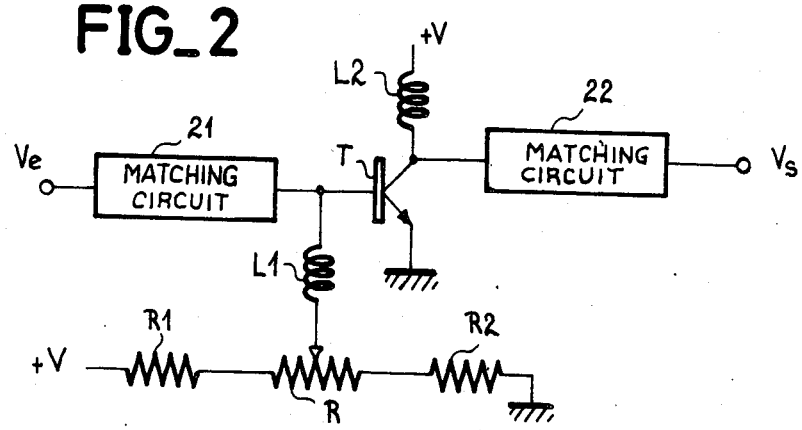
FIG_2
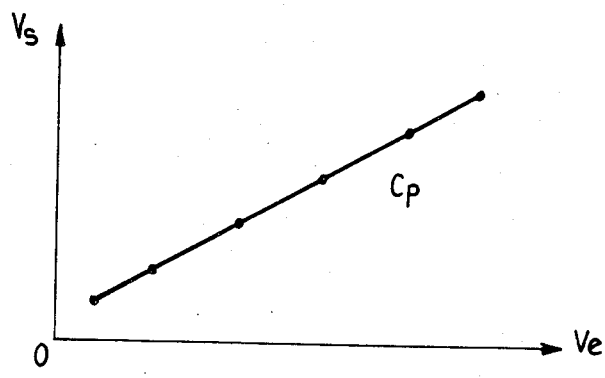
FIG_3

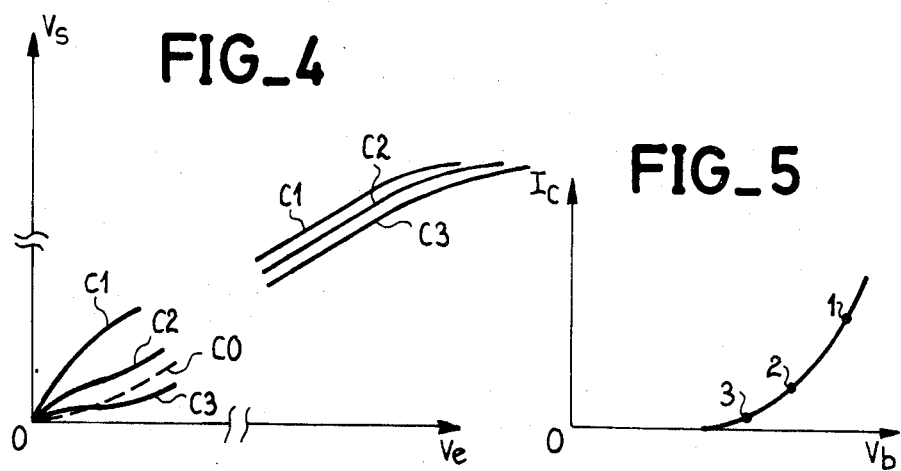
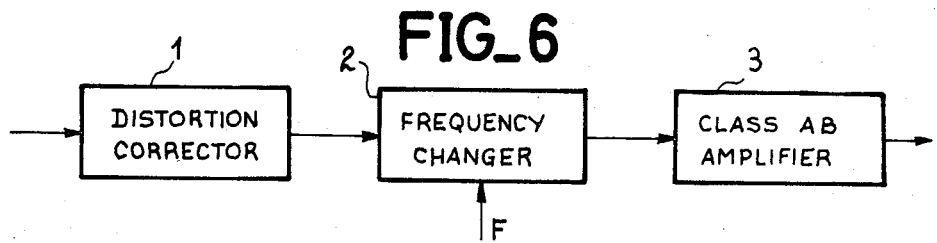
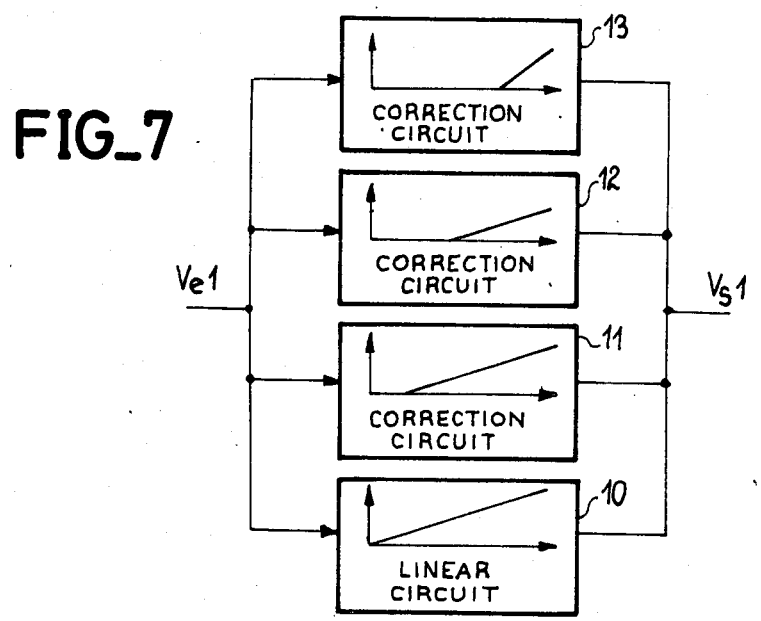

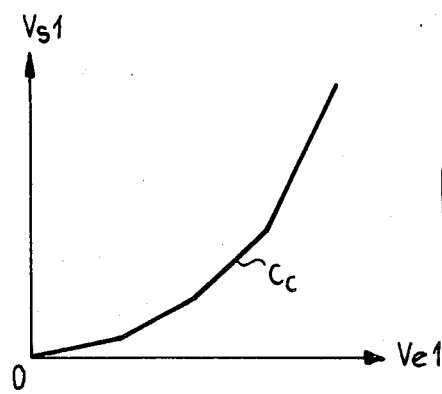
FIG_8
FIG_9 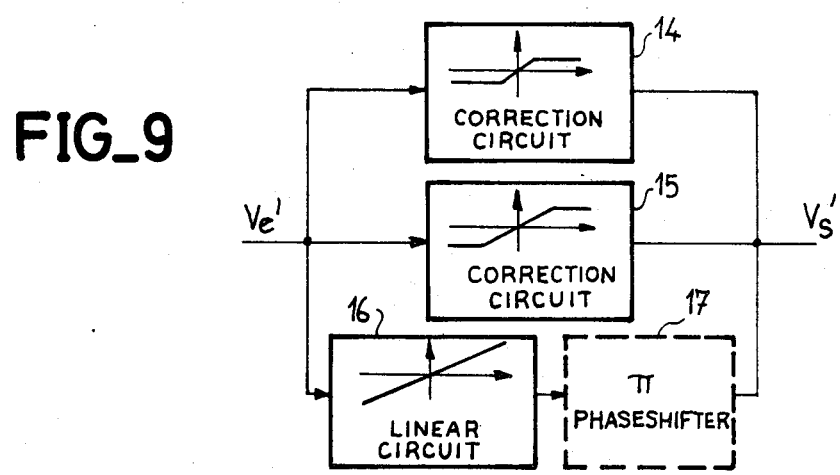
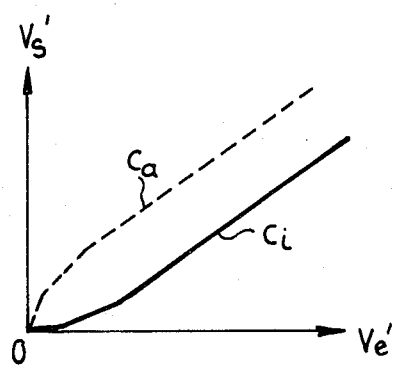
FIG_10

CLASS AB AMPLIFIER AND A DISTORTION CORRECTOR THEREFOR

BACKGROUND OF THE INVENTION

The present invention relates to a class AB amplifier and to a distortion corrector which is associated therewith for obtaining linear amplification and, in particular, linear power amplification for television signals.

It is well known, for example, that amplification of a wave modulated by an assymetric spectrum in the image channel and, the common amplification of sound and image in the same channel, require linear amplifiers. It seems therefore necessary to use class A or class B amplifiers, but considerations of efficiency and feasibility prevent power linear amplification from being obtained in this way. Such amplification is therefore provided in class AB.

Power linear amplification, such as has been practiced up until now, has poor linearity for weak signals. This is due, as will be shown further on, to a well established prejudice.

SUMMARY OF THE INVENTION

The aim of the present invention is to provide good quality class AB linear amplification; this is obtained by going counter to the above mentioned prejudice.

According to the present invention there is provided a class AB amplifier and its distortion corrector, the corrector comprising a trough corrector, wherein the quiescent current of the amplifier is chosen so that the characteristic $Vs=f(Ve)$ of the amplifier (where Ve and Vs are respectively the input and output voltages of the amplifier) drifts with monotonic variation, and wherein the characteristic $Vs'=f(Ve')$ of the trough corrector (where Ve' and Vs' are respectively the input and output voltages of the trough corrector) have a concavity turned towards the increasing values, at least in absolute value, of Vs'.

BRIEF DESCRIPTION OF THE DRAWINGS

The present invention will be better understood and other features will be clear from the following description, with reference to the accompanying Figures which show:

FIG. 1, a first graphic representation relative to class AB amplification,

FIG. 2, a general diagram of a class AB amplifier,

FIGS. 3 to 5 graphs relative to the amplifier of FIG. 2,

FIG. 6, a transmission chamber with class AB amplification,

FIGS. 7 and 9, circuits for the correction of class AB amplifiers, and

FIGS. 8 and 10 graphs relative respectively to the circuits shown in FIGS. 7 and 9.

DETAILED DESCRIPTION OF THE INVENTION

The following description is given in relation to the simultaneous amplification of sound and image television signals, transmitted over the same channel; but the conclusions arrived at are valid whatever the type of signal to be amplified linearly in class AB.

FIG. 1 shows a characteristic $Ic=f(Vb)$ of an amplifier in which Ic designates the collector current of a transistor and Vb the base-emitter voltage of this transistor. In this Figure has been shown the quiescent current Io, dependent on a bias voltage Vbo, characteristic of class AB operation of the amplifier considered. During operation the abscissa vertical Vbo forms the axis of symmetry of the signal to be amplified whose envelope S has been shown in FIG. 1.

FIG. 2 shows the general diagram of a class AB amplifier. This amplifier comprises a common emitter connected NPN power transistor T, with an impedance matching circuit 21 between its base and the input of the amplifier and another impedance matching circuit connected between its collector and the output of the amplifier. The base of the transistor is biased through an assembly formed by an inductance L1, a potentiometer R and two resistors R1, R2; the inductance L1 connects the base of the transistor to the slider of the potentiometer; the ends of the potentiometer are respectively connected to a DC voltage source +V through the resistor R1 and to ground through the resistor R2. The collector of the transistor is biased through an inductance L2 which connects this collector to the voltage +V; the emitter of the transistor is connected directly to ground.

The potentiometer R allows the quiescent current of the transistor to be adjusted in the absence of signal at the input to the amplifier.

FIG. 3 is a graph which shows the variation of the output voltage Vs of the FIG. 2 circuit as a function of the input voltage Ve, the transistor being biased by a small quiescent current Io (see FIG. 1).

For setting the amplifier shown in FIG. 2, adjustment of potentiometer R (FIG. 2) seems the most obvious and the easiest solution. Generally there exists an optimum position of the potentiometer, corresponding to a precise bias current value, for which a minimum value is obtained for the cross modulation products coming from beating between the sound signal and the image signals, and a minimum regeneration value of the attenuated band. However, these minimum values are not satisfactory and observation of the image signal lets streaking be suspected at low signal levels.

In the description, begun with reference to FIG. 3, of the behavior of the transistor, plotting of the curve close to zero requires a scale change of the measuring apparatus, which is neglected. By association of ideas of FIG. 1, the curve Cp can be completed towards the low levels, by a curve similar to that of curve C (FIG. 1) using a concavity opening towards increasing values of Vs; so that the slope (slope=rise/run) of Cp increases in this position with increasing Ve. It is to curve C0 shown with a broken line which will be discussed in connection with the description of FIG. 4.

This leads in attempting to obtain linear amplification, to introducing a corrector element in which the variation of the output voltage Vs', with respect to its input voltage Ve', has the appearance of curve Ca, shown with a broken line in FIG. 10. By way of proof, a document of the firm RCA, entitled "The RCA TTG-10 (III) and TTG-12H internally diplexed television transmitters", presented during the N.A.B. (National Association of Broadcasters) exhibition of 1983, shows on page 6, on the one hand, a correction curve which, for low levels, is of the type of the above mentioned curve Ca and, on the other hand, of course, a response curve of the amplifier to be corrected at the low levels which would be that mentioned above. That is, a concavity increasing in slope towards the increasing values of Vs is yielded. Now, experience has shown that not only for class AB amplifiers equipped with transistors, but also for those equipped with tubes, this is not so: the concavity is turned towards the increasing values of Ve and, at best, depending on the quiescent point chosen, once the first values have been passed, the curve may present a point of change of curve. Only after such a point of change of curve will a concavity turned towards the increasing values of Vs be presented at least to the extent that Ve and Vs are positive voltages. More generally, all that has been stated or will be stated in this specification relative to the curvatures in comparison with the values plotted along the coordinate axes, is valid even if the values considered are negative, provided that only absolute values are taken in account.

FIG. 4 shows a chart of characteristics $Vs=f(Ve)$ for a class AB amplifier as shown in FIG. 2. Three curves C1, C2, C3 have been plotted respectively for three quiescent points 1, 2, 3, shown on the curve of FIG. 5 which gives the variations of the quiescent current Ic of the collector of transistor T as a function of the base bias Vb. Furthermore, in FIG. 4, the curve Co of the behavior of the amplifier is shown in a broken line, such as it was supposed to appear for low levels.

In FIG. 4, the scale is expanded in the neighbourhood of zero, along the two coordinate axes, so as to better show the appearance of curves C0, C1, C2, C3 for low levels. For high levels, the curves all have the appearance already shown in FIG. 3. For low levels, the slope of the curves $Vs=f(Ve)$ of FIG. 4 in the vicinity of zero, are proportional to the slope of the tangent, not shown, to the curve of FIG. 4 at the chosen operating point: point 1 for C1, 2 for C2 and 3 for C3.

The curves C1 to C3 all have, in the vicinity of zero, a curvature increasing towards increasing values of Ve. However, each of the curves C2 and C3 have a point of change of curve in these low levels. These points of change of curve make it difficult to construct a corrector having the reverse characteristics; it is therefore preferable to choose a response of the type of curve C1 for facilitating the correction, namely to choose a response $Vs=f(Ve)$ whose drift has a monotonic variation. The quiescent current of the transistor (or of the tube) in class AB must then be sufficient to avoid a change of curve point on curve $Vs=f(Ve)$. It is not because the cross modulation products will be greater that they will be more difficult to correct. On the contrary, the attitude consisting in wishing to reduce them by biasing, would greatly complicate the correction.

The prejudice which consisted in wishing to correct an amplifier response of the type of curve C0 and not of the type of curve C1 to C3 (FIG. 4) explains why the results obtained were imperfect (in the case where, in reality, the response was of the type of curve C2 and C3) even poor (response of type C1).

The corrector for correcting a class AB amplifier operating at radio frequencies, is practically always inserted in the intermediate frequency in the transmission chain comprising the amplifier; it is sufficient for the transmission quadripole between the corrector and the amplifier to be corrected to have a sufficient passband. This is valid not only for known correctors but also for the correctors of the present invention.

FIG. 6 is the general diagram of a transmission chain with frequency change, in which an amplifier and its distortion corrector are associated for obtaining linear amplification of the input signal. The signal to be transmitted is applied, through a distortion corrector 1, to the signal input of a frequency changer 2 whose frequency change signal is at frequency F; the radio frequency signal, obtained at the output of the frequency changer is applied to the input of class AB amplifier 3. This diagram corresponds to classs AB linear amplification not only in accordance with the prior art but also in accordance with the present invention and, as will be apparent hereafter, the technological modifications required for putting the invention into practice from the prior art, are simple.

A distortion corrector, such as corrector 1 shown in FIG. 6, is formed from a trough corrector intended for correcting low levels and, if the amplifier is operating close to saturation, possibly a peak corrector placed in series with the trough corrector.

A peak corrector used in one embodiment of the invention is shown in FIG. 7. It is formed from four parallel circuits, one of which 10 is linear and the other three of which are correction circuits operating in class C. These four circuits, which have variable gain and bias, allow the thresholds and efficiency of the correction to be adjusted. The resulting 'output signal Vs1 with respect to the input signal Ve1' characteristic is shown in FIG. 8 as a jagged line Cc which is an approximation of the curve pattern to be obtained for making the response of the transmission chain of FIG. 6 linear at medium and high levels of the signals. Equivalent peak correctors are to be found in known distortion correctors used for obtaining linear amplification whatever the operating class.

A trough corrector used in one embodiment of the invention is shown in FIG. 9; its response curve $Vs'=f(Ve')$ is shown by curve Ci in FIG. 10; it is substantially the reverse curve of curve Ca shown with a broken line in FIG. 10 and which, in accordance with the prejudice, was used for attempting to make the response of the transmission chain of FIG. 6 linear at low levels. The trough corrector of FIG. 9 comprises three branches connected in parallel with, in the first one, a correction circuit 14 formed by a symmetric linear amplifier with clipping thresholds, in the second correction circuit 15 formed by a symmetric linear amplifier with clipping thresholds which are different from those of FIG. 14 and, in the third a linear circuit 16 in series with a $\pi$ phase shifter 17.

The curve Ca of FIG. 10, i.e. the correction curve according to the prejudice, would be obtained by adding the output signals of the three circuits 14 to 16, without phase shifting by $\pi$; thus, the diagram of FIG. 9 corresponds, by replacing the phase shifter 17 by a short circuit, to a trough corrector in accordance with the prejudice. In order to obtain curve Ci, the reverse of curve Ca, it is not required to add together the output signals of the three circuits 14 to 16, but to effect a subtraction between the output signal of the linear channel i.e. circuit 16, and the output signals of the correction circuits 14 and 15. For this subtraction, it is sufficient to phase shift by $\pi$; this is the role of the phase shifter 17 of FIG. 9, which has been shown by a rectangle with a broken line outline. This broken line representation of phase shifter 17 serves a dual purpose: on the one hand it shows the difference between a trough corrector in accordance with the prejudice and a trough corrector in which the prejudice has been overcome and, on the other hand, it shows that the subtraction of which it was a question is not necessarily effected by the addition of this phase shifter; in order to obtain this subtraction from the trough corrector according to the prejudice, it is in fact also possible either to suppress an inverter stage in the correction circuit 16 if it has one, or to add a $\pi$ phase shifter in series with the correction circuits 14 and 15, or to suppress an inverter stage in each of the correction circuits 14 and 15 if they each have one.

The present invention is not limited to the example described, thus the peak correctors may be formed by any method already used in the distortion correctors formed in accordance with the prejudice; the same goes for trough correctors, except for inversion of the curve (see FIG. 10). As for the distortion corrector, it may be disposed not only in the intermediate frequency, as in the case of FIG. 6, but also in the radio frequency, before or after the class AB amplifier.

What is claimed is:

1. A class AB amplifier including a distortion corrector, the corrector comprising a trough corrector, the quiescent current of the amplifier being chosen so that the characteristic $Vs = f(Ve)$ of the amplifier, where Ve and Vs are respectively the input and output voltages of the amplifier has a monotonic variation drift, and wherein the characteristic $Vs' = f(Ve')$ of the trough corrector where Ve' and Vs' are respectively the input and output voltages of the trough corrector has a concavity which increases in absolute value of slope towards increasing absolute values of Vs'.

2. An amplifier and its distortion corrector as claimed in claim 1, wherein the amplifier operates at radio frequency and wherein the distortion corrector operates at intermediate frequency.

* * * * *